United States Patent
Lee

(10) Patent No.: US 7,407,312 B2
(45) Date of Patent: Aug. 5, 2008

(54) LUMINESCENT DIODE, FABRICATION METHOD THEREOF, AND BACKLIGHT ASSEMBLY HAVING THE SAME

(75) Inventor: Jae Young Lee, Dacjun-si (KR)

(73) Assignee: LG Display Co., Ltd., Seoul (KR)

( * ) Notice: Subject to any disclaimer, the term of this patent is extended or adjusted under 35 U.S.C. 154(b) by 35 days.

(21) Appl. No.: 11/452,355

(22) Filed: Jun. 14, 2006

(65) Prior Publication Data

US 2007/0153545 A1    Jul. 5, 2007

(30) Foreign Application Priority Data

Dec. 29, 2005    (KR) .................. 10-2005-0133193

(51) Int. Cl.
*F21V 7/04* (2006.01)
(52) U.S. Cl. .................. 362/555; 362/561; 362/612
(58) Field of Classification Search .................. 362/29, 362/30, 551, 554, 555, 556, 561, 582, 606, 362/608, 612, 621; 264/1.24, 1.7
See application file for complete search history.

(56) References Cited

U.S. PATENT DOCUMENTS 5,375,043 A * 12/1994 Tokunaga .................. 362/561
6,050,704 A * 4/2000 Park ........................... 362/29
6,154,595 A * 11/2000 Yokogawa et al. .......... 362/582

FOREIGN PATENT DOCUMENTS

JP    55138891 A  * 10/1980
KR    2005109294 A * 11/2005

* cited by examiner

*Primary Examiner*—Y M. Lee
(74) *Attorney, Agent, or Firm*—McKenna, Long & Aldridge LLP

(57) ABSTRACT

A luminescent diode (LED) that improves brightness uniformity, a fabrication method thereof, and a backlight assembly having the same are disclosed. The LED includes an LED chip that emits light in a side surface of an LCD device; and an optical guide element on the LED chip that enlarges a radiation angle of the light. The LED may alternatively include an LED chip that emits light on a bottom surface of the LCD device; and an optical guide element on the LED chip that enlarges a radiation angle of the light. The radiation angle of light maximally enlarged to prevent hot spots caused by brightness nonuniformity. An enhanced image quality results.

9 Claims, 10 Drawing Sheets

<SIDE VIEW>

<SECTIONAL VIEW>

<LIGHT-PROPAGATING VIEW> ured States Patent (US 7,407,312 B2)

LUMINESCENT DIODE, FABRICATION METHOD THEREOF, AND BACKLIGHT ASSEMBLY HAVING THE SAME

This application claims the benefit of Korean Patent Application No. 10-2005-0133193, filed on Dec. 29, 2005, which is hereby incorporated by reference for all purposes as if fully set forth herein.

BACKGROUND OF THE INVENTION

1. Field of the Invention

The present invention relates to a luminescent diode (LED) that improves rightness uniformity. The present invention also relates to a fabrication method of the LED and a backlight assembly having the LED.

2. Discussion of the Related Art

Data processors have been recently developed to have various shapes, various functions and higher data-processing speed. Because the data processed in the data processor is in the form of an electrical signal, a display device is needed to check the data processed in the data processor.

Display devices include flat panel display devices. A liquid crystal display (LCD) device is a type of flat panel display device. An LCD device displays images using liquid crystal. LCD devices are advantageous in industrial fields because they are thin, light, consume low power and have a low operational voltage.

In most cases, LCD devices are configured to include a liquid crystal panel that displays images and a backlight assembly that supplies light to the liquid crystal panel.

A light source in the backlight assembly may use electroluminescence (EL), a cold cathode fluorescent lamp (CCFL), a hot cathode fluorescent lamp (HCFL), a luminescent diode (LED), etc.

A backlight assembly including a CCFL is problematic because mercury contained in the lamp bonds easily with metal to form an amalgam. This shortens the lifetime of the lamp. Moreover, the backlight assembly including the CCFL has shortcomings. For example, as temperature varies, the brightness of the assembly may vary severely. Also, it is problematic to dispose of mercury, a virulently poisonous heavy metal.

However, backlight assemblies including an LED do not have these shortcomings. Therefore, backlight assembly including an LED have been developed.

An LED includes a point light source, which may be configured with a plurality of LEDs emitting red, green and/or blue light, or a plurality of LEDs emitting white light. Backlight assemblies including LEDs have a smaller size than other backlight assemblies and are able to better maintain light uniformity. Thus, these backlight assemblies are high-brightness backlight assemblies.

LCD devices may be classified into two types according to the arrangement of the light source. The two types are an edge type LCD device and a direct type LCD device. In an edge type LCD device, the backlight assembly includes a light source on a side surface of the LCD device and a light guide plate that guides light emitted from the LED towards the front of the LCD device. The light guide plate is disposed behind a liquid crystal panel. In a direct type LCD device, the backlight assembly includes a plurality of light sources behind a liquid crystal panel. The light emitted from the plurality of light sources is directly irradiated on the liquid crystal panel which is disposed in front of the plurality of light sources.

A related art LCD will be illustrated with reference to the accompanying drawings.

FIG. 1 is an exploded perspective view of a related art edge type LCD device.

Referring to FIG. 1, the backlight assembly 20 includes a bottom case 90, a plurality of LEDs 60, a printed circuit board (PCB) 61 that supplies power to the LEDs 60, a housing 62 that protects the LEDs 60, a light guide plate 50 that converts light generated from the LEDs 60 into a surface light source, and optical sheets 30. The plurality of LEDs 60 may be disposed on a side surface of the bottom case 90 such that they are spaced apart by a predetermined distance. The plurality of LEDs 60 emit light. In addition, the optical sheets 30 are disposed over the light guide plate 50 and aid in diffusing and condensing light.

The backlight assembly 20 may further include a reflective plate 70 that may be attached or coated on the bottom case 90.

The plurality of LEDs 60 emit light when power is supplied by the PCB 61. The light emitted from the plurality of LEDs 60 is inputted into and guided through the light guide plate 50 so that it is irradiated frontward towards a liquid crystal panel 10 disposed in front of the light guide plate 50.

FIG. 2 is an enlarged perspective view of an LED 60 of the related art edge type LCD device.

Referring to FIG. 2, a related art LED 60 has predetermined radiation angles with respect to X-X' and Y-Y' axes based on a reference point. A radiation angle refers to a maximum angle of emitted light. The related art LED 60 may have predetermined radiation angles of about 110° with respect to the X-X' and Y-Y' axes based on the reference point.

The related art LED 60 is a point light source having an emitting area less than that of a CCFL. Thus, the related art LED 60 may be slim and is therefore easily applied in small-sized edge type LCD devices.

FIG. 3 is a schematic view illustrating external defects of the related art edge type LCD device.

Referring to FIG. 3, the related art LCD device includes a liquid crystal panel 10, a top case 11 that protects the liquid crystal panel 10, and a plurality of LEDs 60 disposed on one side surface of the LCD device. The plurality of LEDs 60 supply light to the liquid crystal panel 10.

In the related art LCD device, because the radiation angle of an LED 60 is about 110°, a bright portion A and a dark portion B are formed in regions in a side of the liquid crystal panel 10 corresponding to regions where the plurality of LEDs 60 are disposed.

As shown, bright portions A and dark portions B are alternately repeated in a predetermined region of the liquid crystal panel 10. This causes the brightness of the LCD device to become non-uniform. These non-uniformities cause hot spots. The bright portion A corresponds to a region within the radiation angle (about 110°) of the light emitted from the LED 60. The dark portion B corresponds to a region outside of the radiation angle (about 110°) of the light emitted from the LED 60. Hot spots are external defects in LCD devices and therefore, result in reduced LCD device production yields.

SUMMARY OF THE INVENTION

Accordingly, the present invention is directed to a luminescent diode (LED), a fabrication method thereof, and a backlight assembly having the same that substantially obviate one or more of the problems due to limitations and disadvantages of the related art.

An advantage of the present invention is to provide an LED that improves brightness uniformity by preventing external defects that cause brightness nonuniformity, a fabrication method thereof, and a backlight assembly having the same.

Another advantage of the present invention is to provide an LED with a plurality of optical fibers disposed therein such that the optical fibers change an optical path for light, a fabrication method thereof, and a backlight assembly having the same.

Additional features and advantages of the invention will be set forth in the description which follows, and in part will be apparent from the description, or may be learned by practice of the invention. The objectives and other advantages of the invention will be realized and attained by the structures and method particularly pointed out in the written description and claims hereof as well as the appended drawings.

To achieve these and other advantages and in accordance with the purpose of the present invention, as embodied and broadly described, a luminescent diode (LED) for a liquid crystal display (LCD) device includes an LED chip that emits light on a side surface of the LCD device; and an optical guide element on the LED chip that enlarges a radiation angle of the light.

In another aspect of the present invention, a method of fabricating a luminescent diode (LED) includes mounting an LED chip on a substrate; electrically connecting the LED chip by wire bonding; forming a partition wall over edges of the substrate; molding a first insulating material into an interior surrounded by the partition wall; fixing an optical guide element in the first insulating material; and molding a second insulating material on the first insulating material.

In another aspect of the present invention, a backlight assembly includes a light source having an optical guide element, wherein the optical guide element enlarges a radiation angle of light; and an optical sheet that diffuses and condenses light emitted from the light source.

In another aspect of the present invention, a luminescent diode (LED) for a liquid crystal display (LCD) device includes an LED chip that emits light on a bottom surface of the LCD device; and an optical guide element on the LED chip that enlarges a radiation angle of the light.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to an, embodiment of the present invention, example of which is illustrated in the accompanying drawings. Wherever possible, the same reference numbers will be used throughout the drawings to refer to the same or like parts.

The present invention incorporates a plurality of optical fibers in a luminescent diode (LED) to enlarge the radiation angle of light. This enables an improved image quality because hot spots caused by brightness nonuniformity are prevented due to the enlarged radiation angle of light.

Figure 1:
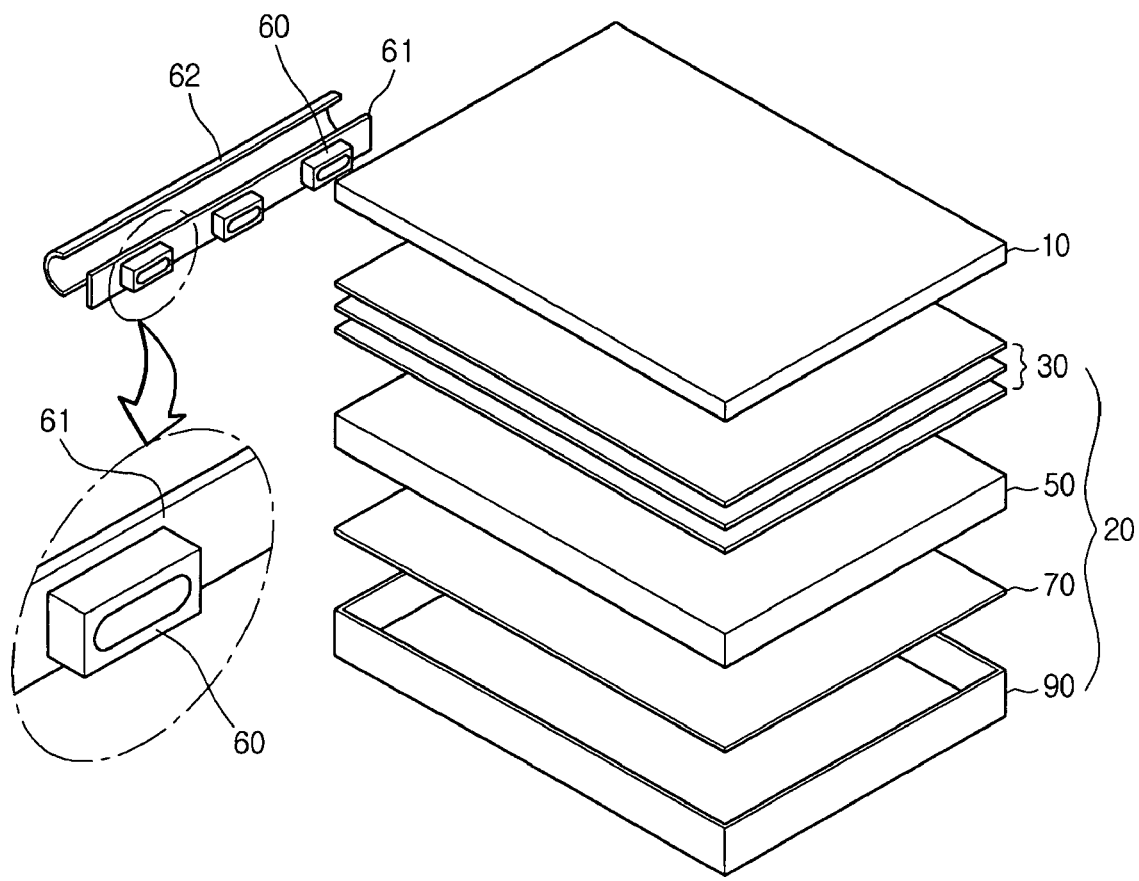
FIG. 1 is an exploded perspective view of a related art edge type liquid crystal display (LCD) device.
Figure 2:
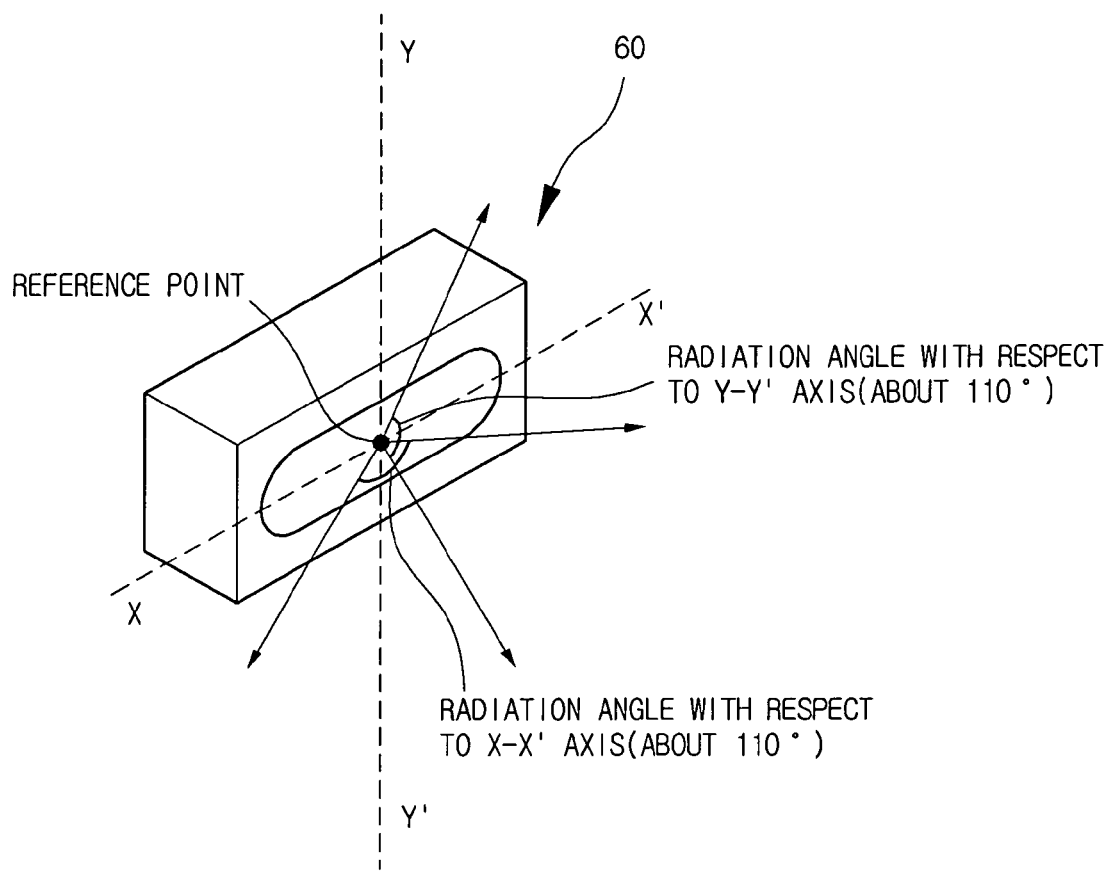
FIG. 2 is an enlarged perspective view of a luminescent diode (LED) of the related art edge type LCD device.
Figure 3:
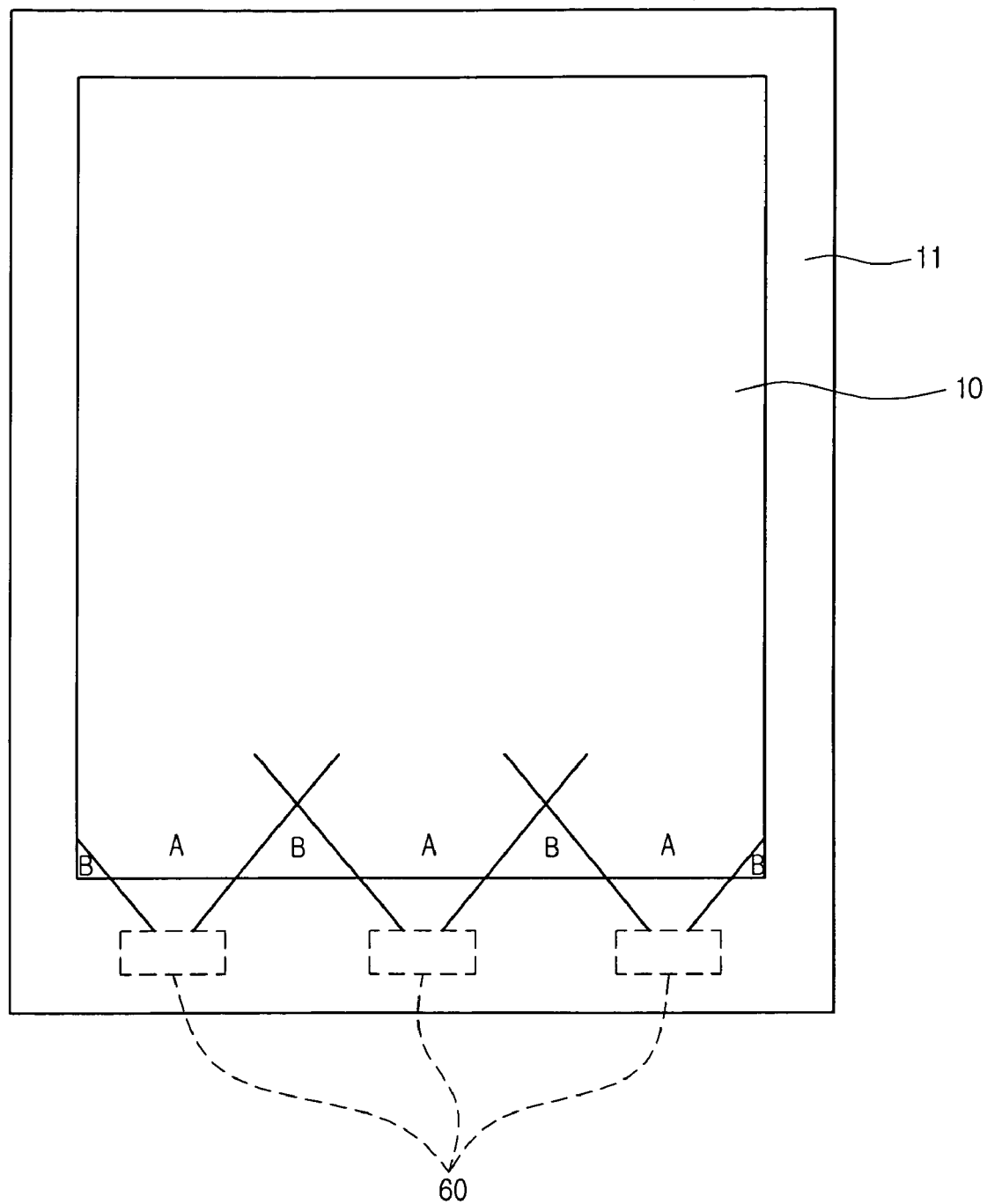
FIG. 3 is a schematic view illustrating external defects of the related art edge type LCD device.
Figure 4:
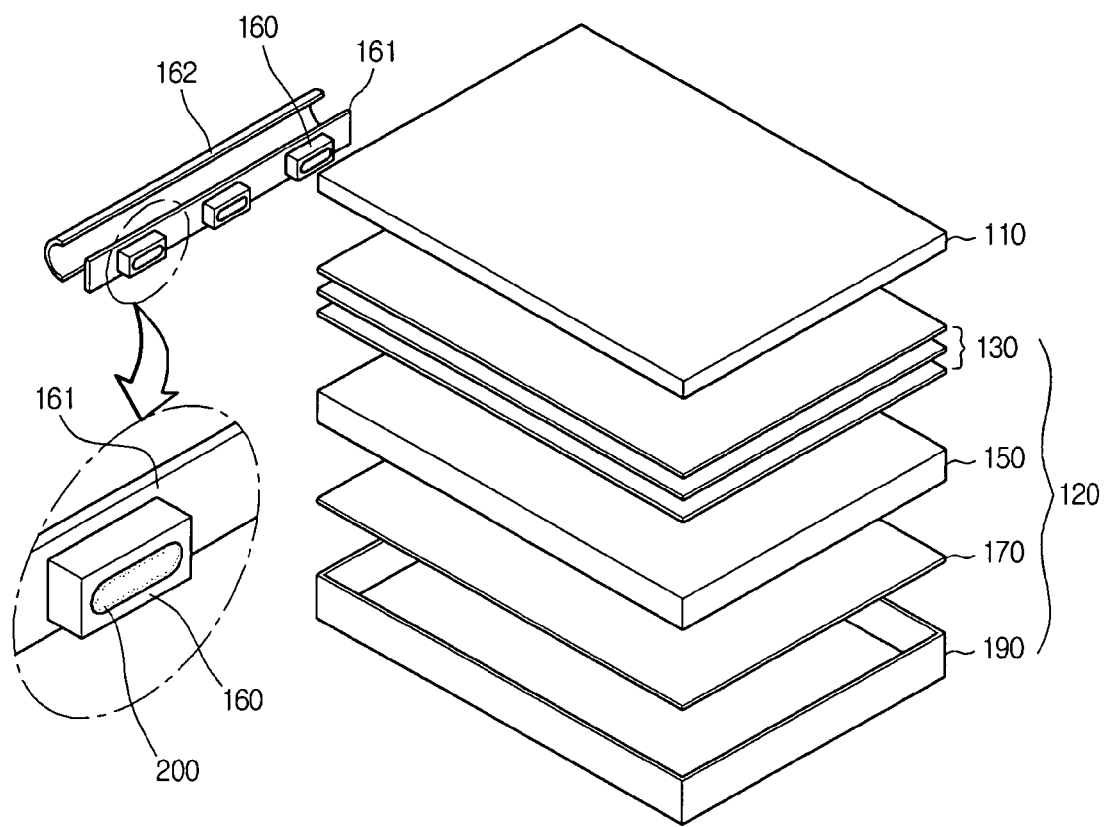
FIG. 4 is an exploded perspective view of an edge type LCD device according to an embodiment of the present invention.

FIG. 4 is an exploded perspective view of an edge type liquid crystal display (LCD) device according to an embodiment of the present invention.

Referring to FIG. 4, the LCD device of the present invention includes a liquid crystal panel 110 that displays an image and a backlight assembly 120 that supplies light.

The backlight assembly 120 includes a bottom case 190. The backlight assembly 120 also includes a plurality of LEDs 160 that are light sources and that emit light, a printed circuit board (PCB) 161 that applies a voltage to the LEDs 160, a housing 162 that protects the plurality of LEDs 160, a light guide plate 150 that converts light emitted from the plurality of LEDs 160 into a surface light source, a reflective plate 170 that reflects light irradiated under the light guide plate 150, and optical sheets 130 that aid in diffusing and condensing light from the light guide plate 150.

The backlight assembly 120 may further include a heat sink (not shown) that absorbs heat generated from the plurality of LEDs 160.

Each of the plurality of LEDs 160 may be configured to include an LED that emits white light.

However, the plurality of LEDs 160 of the present invention are not limited to including LEDs that emit white light. The plurality of LEDs 160 may be configured to include red (R), green (G) and blue (B) LEDs. In addition, the plurality of LEDs 160 may be configured to include a combination of LEDs that emit red (R), green (G), blue (B) and/or white (W) light.

Each of the plurality of LEDs 160 includes a plurality of optical fibers 200 that change the optical path of light to diffuse the light.

Each of the optical fibers 200 may be a glass optical fiber made of glass material or a plastic optical fiber made of plastic material. The plastic material may have strength such that the plastic material is resistant to bending.

Each of the optical fibers 200 may be fixed by an epoxy on an LED chip in each of the LEDs 160. Each of the optical fibers 200 may be fixed such that it is inclined at a predetermined angle in a range of about 20° to about 60° with respect to the LED chip.

The related art LED emits light at a radiation angle of about 110°, whereas the LED 160 of the present invention may emit light at a predetermined radiation angle greater than at least 110° due to the presence of the optical fiber 200. Therefore, the optical fiber 200 induces the radiation angle to be enlarged.

Each of the LEDs 160 may be slim and has a radiation angle of at least 110°. However, each of the LEDs 160 may have a large radiation angle greater than 110° when each of the optical fibers 200 is incorporated therein. Therefore, the LCD device having the LED 160 with the radiation angle of 110° or greater has decreased number of hot spots that are caused by brightness nonuniformity. Thus, the LCD device may display an improved image.

Figure 5:
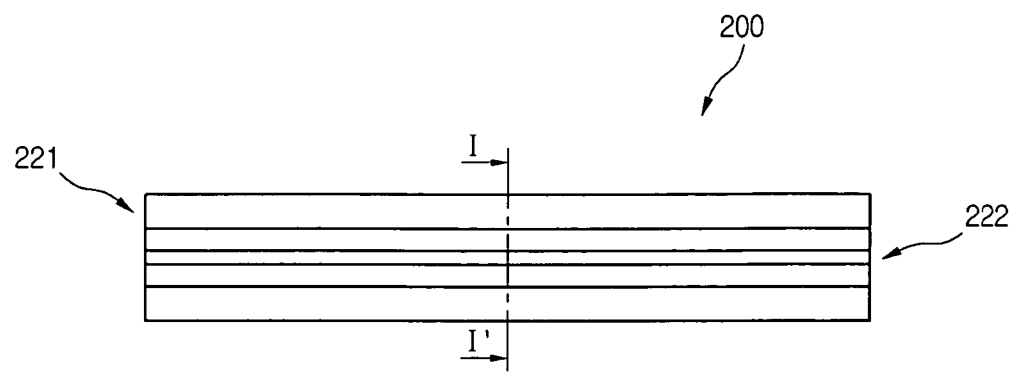
FIG. 5 is a schematic view illustrating an optical fiber according to an embodiment of the present invention.
Figure 5:
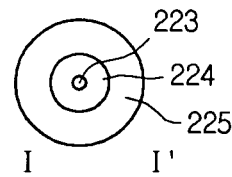
Figure 5:
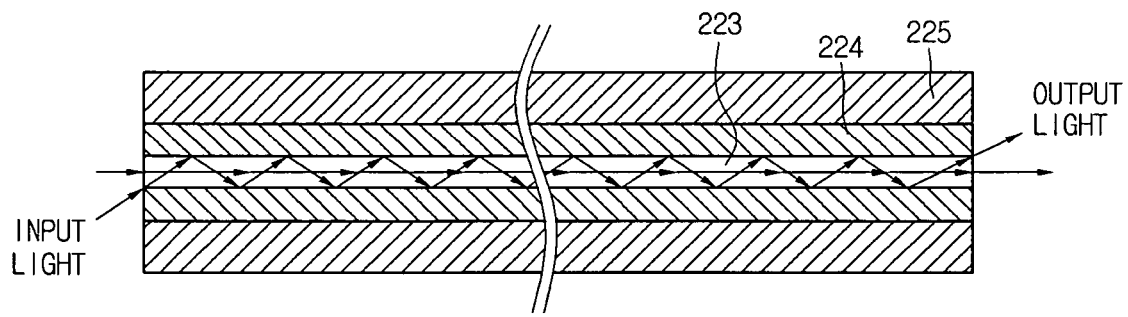

FIG. 5 shows a side view, a sectional view and a light-propagating view that illustrate the optical fiber 200 of the present invention. The light-propagating view is a schematic view illustrating how light propagates in the optical fiber 200.

Referring to FIG. 5, the optical fiber 200 includes an input end 221 that receives light, an output end 222 that releases light, a core 223 in which light propagates, a cladding layer 224 on the core 223 that reflects light, and a coating layer 225 on the cladding layer 224 that intensifies the strength of the optical fiber 200.

The distance between the input end 221 and the output end 222 is about 750 μm, and the diameter of the optical fiber is about 250 μm.

The light that enters through the input end 221 propagates in the core 223 while being reflected by the cladding layer 224. The light exits through the output end 222.

The optical fiber 200 may be classified into a glass optical fiber and a plastic optical fiber according to the materials that form the optical fiber 200.

The glass optical fiber may be classified into a silica-based optical fiber, a fluorine-based optical fiber, a rare earth-based optical fiber, etc.

The silica-based optical fiber is made of silica. In order to differentiate the refractive index of the light, a dopant such as F, $B_2O_3$, $P_2O_3$, etc. is doped into silica oxide. The refractive index may increase or decrease based on the dopant. The refractive index of the cladding layer 224 should be less than that of the core 223.

The silica-based optical fiber is advantageous in that it is not fragile, even when temperature varies abruptly. The silica-based optical fiber is not deformed at high temperatures, e.g., about 1,000° C. The silica-based optical fiber also has a low thermal expansion coefficient.

A fluorine-based optical fiber has been used because fluoride glass was developed in 1975. In a fluorine-based optical fiber, transmission loss is very small in the light wavelength range of 0.2 μm to 8 μm, e.g., 2.55 μm.

The rare earth-based optical fiber has beneficial optical and magnetic properties. The rare earth-based optical fiber is formed by doping a rare earth element into a passive optical fiber which merely transmits light. The rare earth elements may include niobium (Nb), erbium (Er), dysprosium (Dy), terbium (Th), cerium (Ce), europium (Eu), thulium (Tm), ytterbium (Yb), praseodymium (Pr), etc. The rare earth-based optical fiber may include an Er-doped optical fiber in which Er is doped into the core of the silica-based optical fiber.

Plastic optical fibers employ an optically transparent polymer material. Plastic optical fibers may be beneficial because glass may be fragile, brittle, and hard to form in a desired shape of a predetermined size. The plastic optical fiber may use an acryl-based polymer as the core material and a fluorine-based polymer as the cladding material.

Plastic optical fibers are resistant to vibrations and bending. Thus, they may be used in narrow regions. In addition, plastic optical fibers do not generate heat. Thus, they may be used in lighting for displays or lighting for an apparatus used in a heat-sensitive semiconductor process.

For example, the optical fiber 200 of the present invention may employ a plastic optical fiber which has intensified strength and is resistant to heat.

Figure 6:
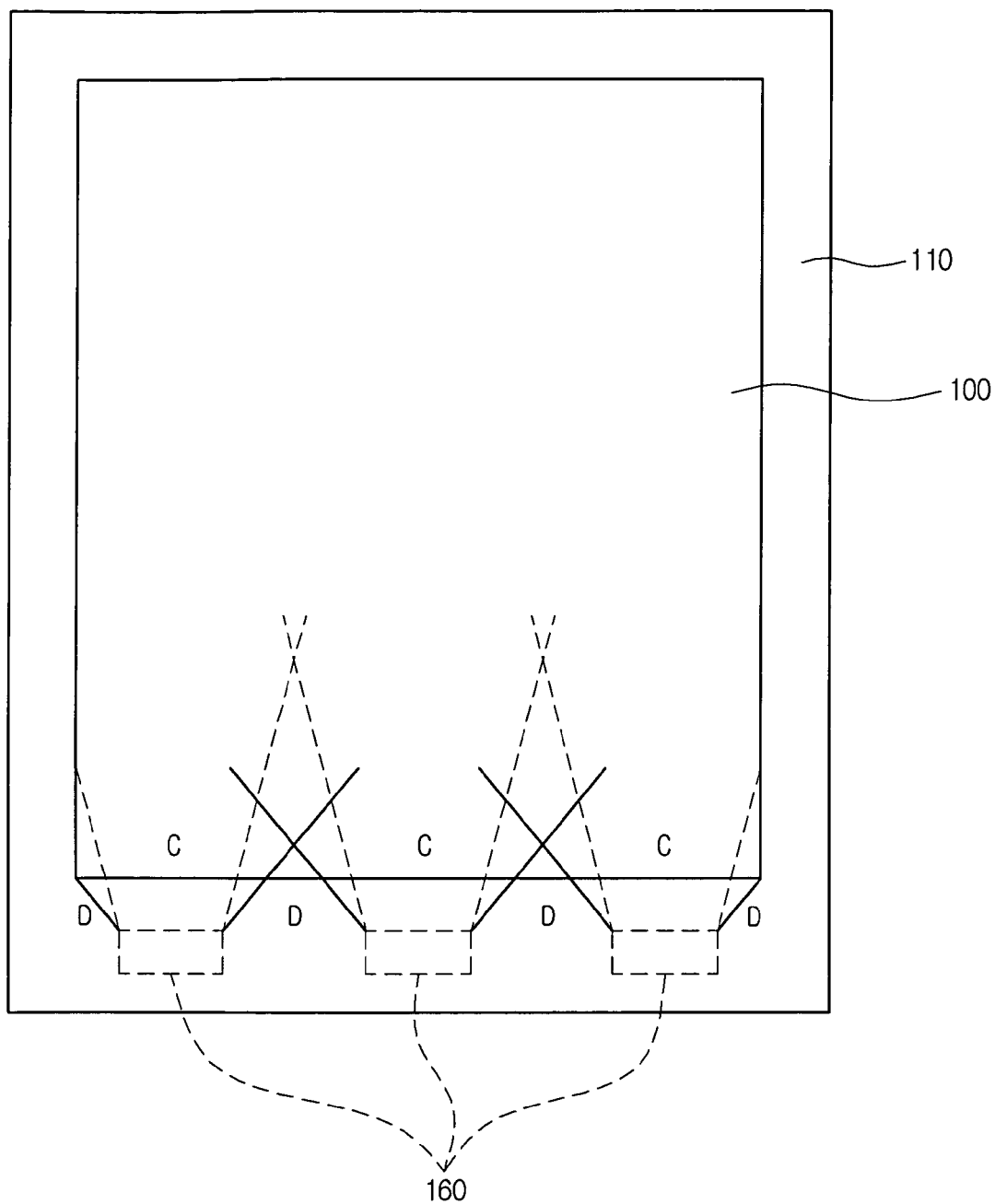
FIG. 6 is a schematic view illustrating a lack of external defects in the edge type LCD device according to an embodiment of the present invention.

FIG. 6 is a schematic view illustrating minimization of external defects in the edge type LCD device according to an embodiment of the present invention.

Referring to FIG. 6, the LCD device of the present invention includes the liquid crystal panel 110, a top case 111 that protects the liquid crystal panel 110, a plurality of LEDs 160 disposed on one side of the LCD device that supply light to the liquid crystal panel 110. The LED 160 incorporates the optical fiber 200 that enlarges the radiation angle.

Each of the optical fibers is fixed on the LED chip (not shown) of each of the LEDs 160 such that it is inclined at a predetermined angle in a range of about 20° to about 60°. Thus, the optical fibers enlarge the radiation angle of the LEDs 160 so that the angle is greater than 110°.

In the LCD device, a bright portion C and a dark portion D are inevitably formed when the LCD device is operating. However, because the optical fiber in the LED 160 is inclined at a tilt angle of about 20°-60° to enable the radiation angle of light to be greater than 110°, the dark portion D is formed in a small region that does not greatly affect an image display region of the liquid crystal panel 110, when the image display region is defined as being at one side of a displaying screen in the liquid crystal panel 110. Accordingly, it is possible to prevent external defects due to brightness nonuniformity.

FIGS. 7A to 7E are sectional views illustrating a method of fabricating an LED according to an embodiment of the present invention.

Figure 7A:
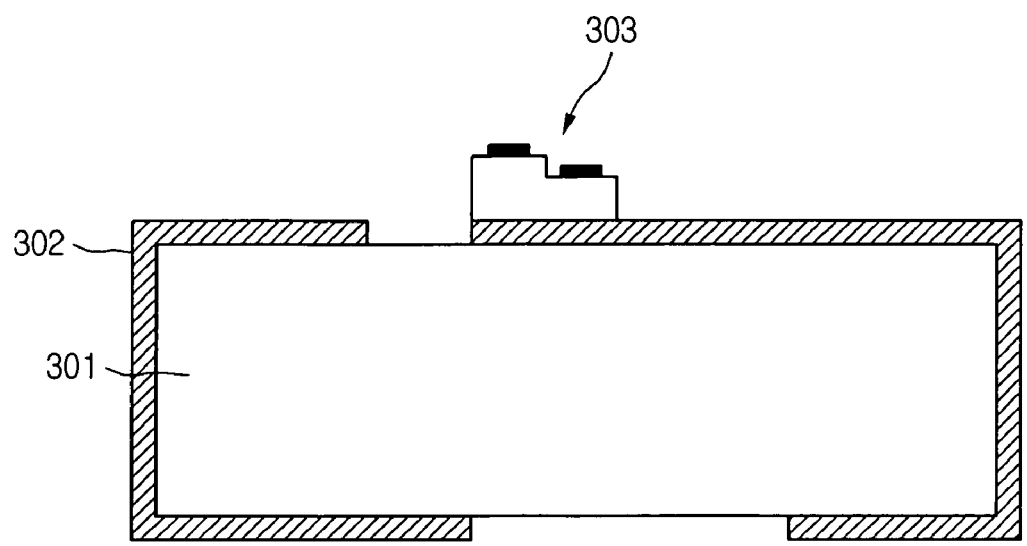
FIGS. 7A, 7B, 7C, 7D and 7E are sectional views illustrating a method of fabricating an LED according to an embodiment of the present invention.

Referring to FIG. 7A, a lead frame 302 for the backlight is formed on an outer periphery of a silicon substrate 301 and an LED chip 303 is mounted on the lead frame for the backlight.

Figure 7B:
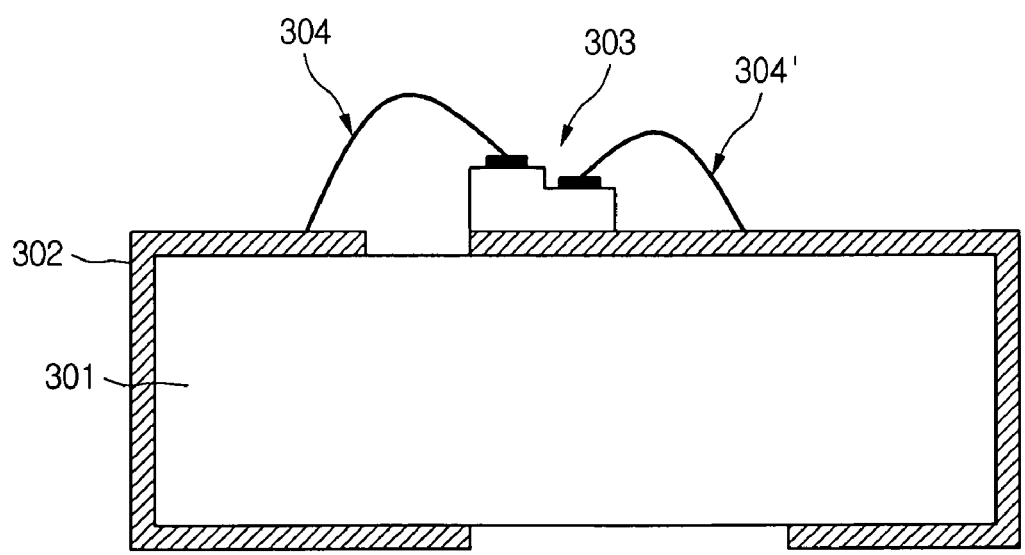

Thereafter, referring to FIG. 7B, P and N electrodes of the mounted LED chip 303 are drawn out and then electrically connected with a lead wire pattern on the lead frame 302 by a wire bonding process using wires 304 and 304'.

Figure 7C:
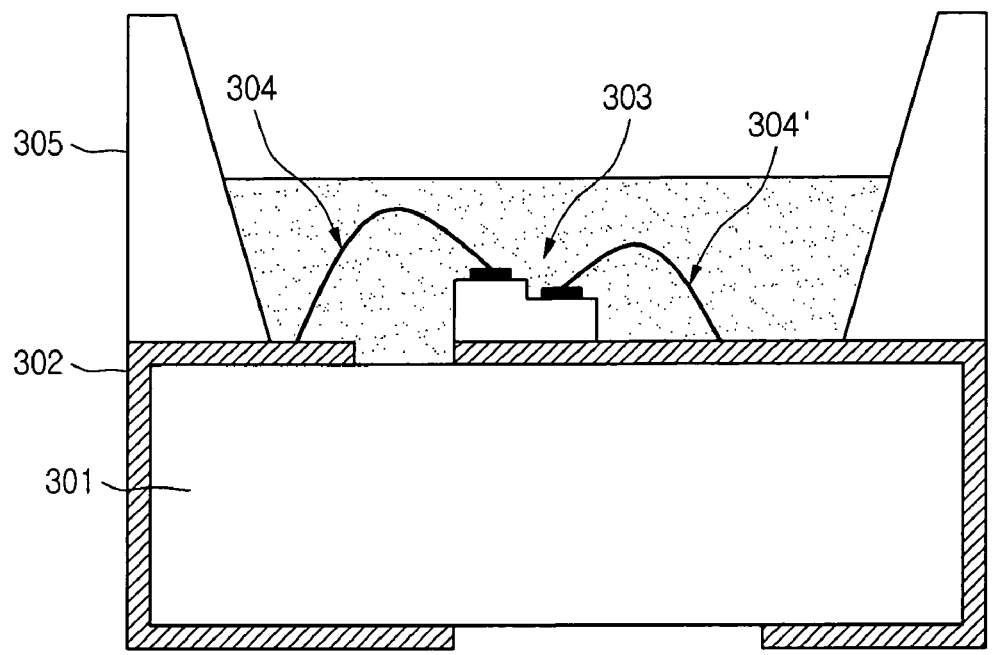

Referring to FIG. 7C, after completing the bonding of wires 304 and 304' to the LED chip 303, a partition wall 305 is formed on an edge periphery over the silicon substrate 301. Thereafter, a fluorescent mold 306 is molded into the interior surrounded by the partition wall 305 such that the LED chip 303 is buried in the fluorescent mold 306. A fluorescent material is mixed in the fluorescent mold 306.

Figure 7D:
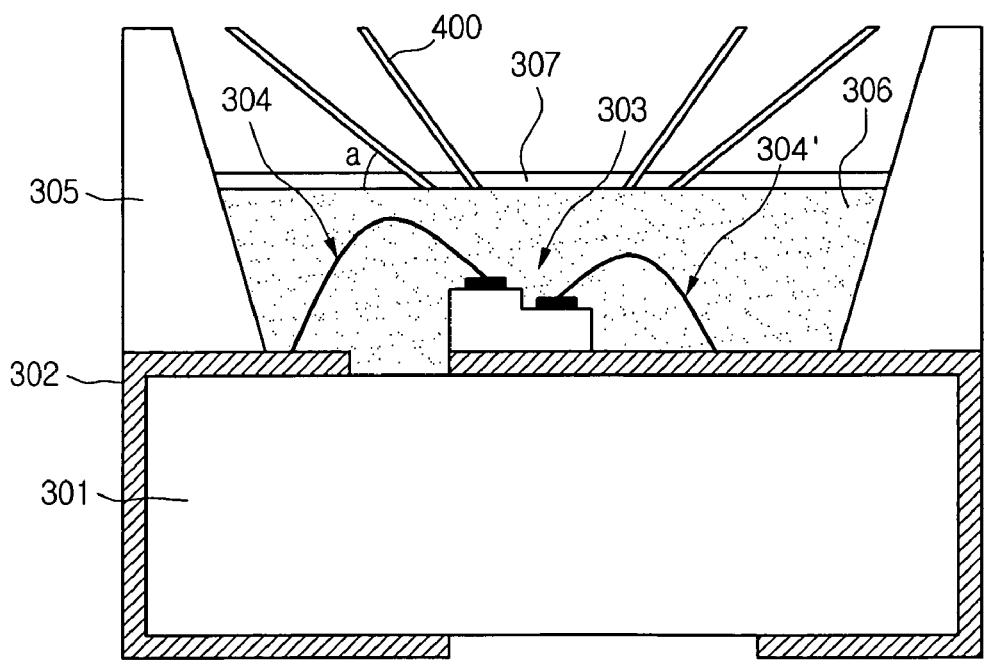

Referring to FIG. 7D, a first epoxy 307 is molded on the fluorescent mold 306. Afterwards, a plurality of optical fibers 400 are mounted on the first epoxy 307 before the first epoxy 307 is completely hardened.

Each of the optical fibers 400 is fixed such that it is disposed along a periphery over a region where each of the optical fibers 400 is formed to have a predetermined tilt angle "a".

The tilt angle "a" of the optical fiber 400 is in a range of about 20°-60°. The length of the optical fiber 400 may be about 750 μm and the diameter of the optical fiber 400 maybe about 250 μm.

Figure 7E:
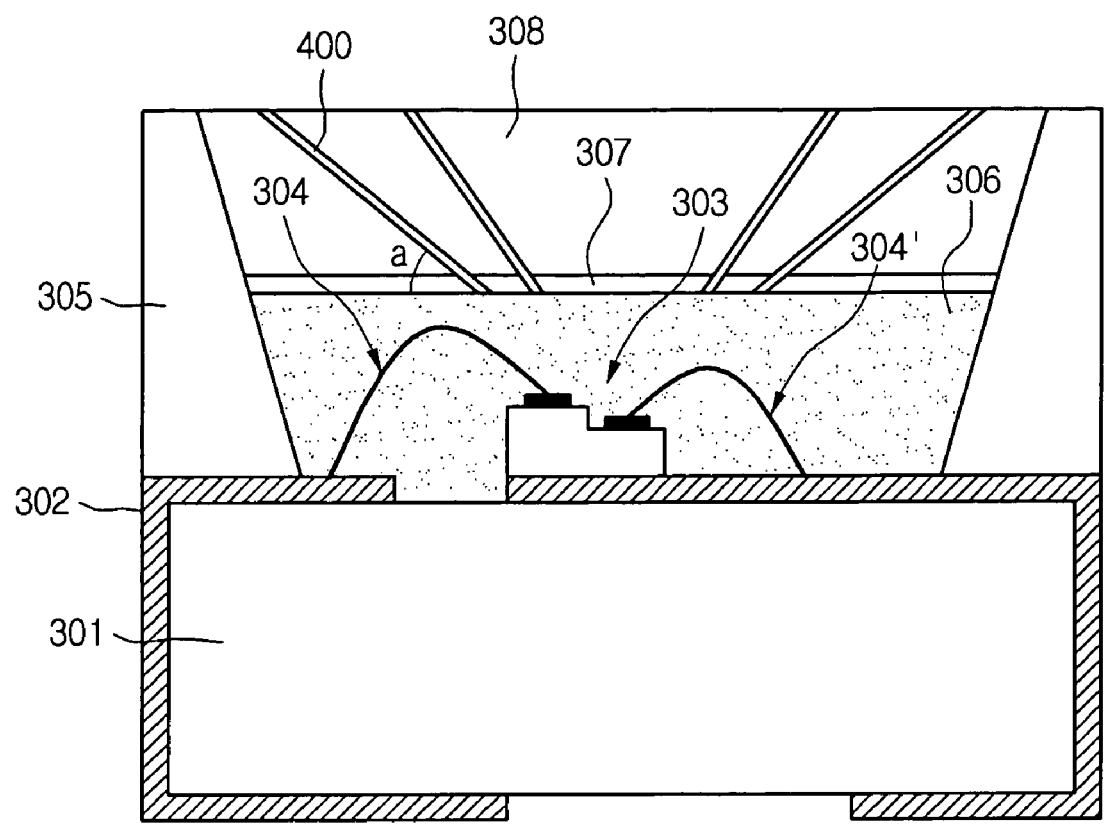

Referring to FIG. 7E, after the first epoxy 307 is hardened and the plurality of optical fibers 400 are fixed, a second epoxy 308 is molded over the first epoxy 307 and the plurality of optical fibers 400.

Blue light may be generated from the blue LED chip 303. This blue light may be converted into white light through selection of a fluorescent material of the fluorescent mold 306 so that white light is outputted.

An optical path of a portion of the white light is changed by the arrangement of the plurality of optical fibers 400.

Figure 8:
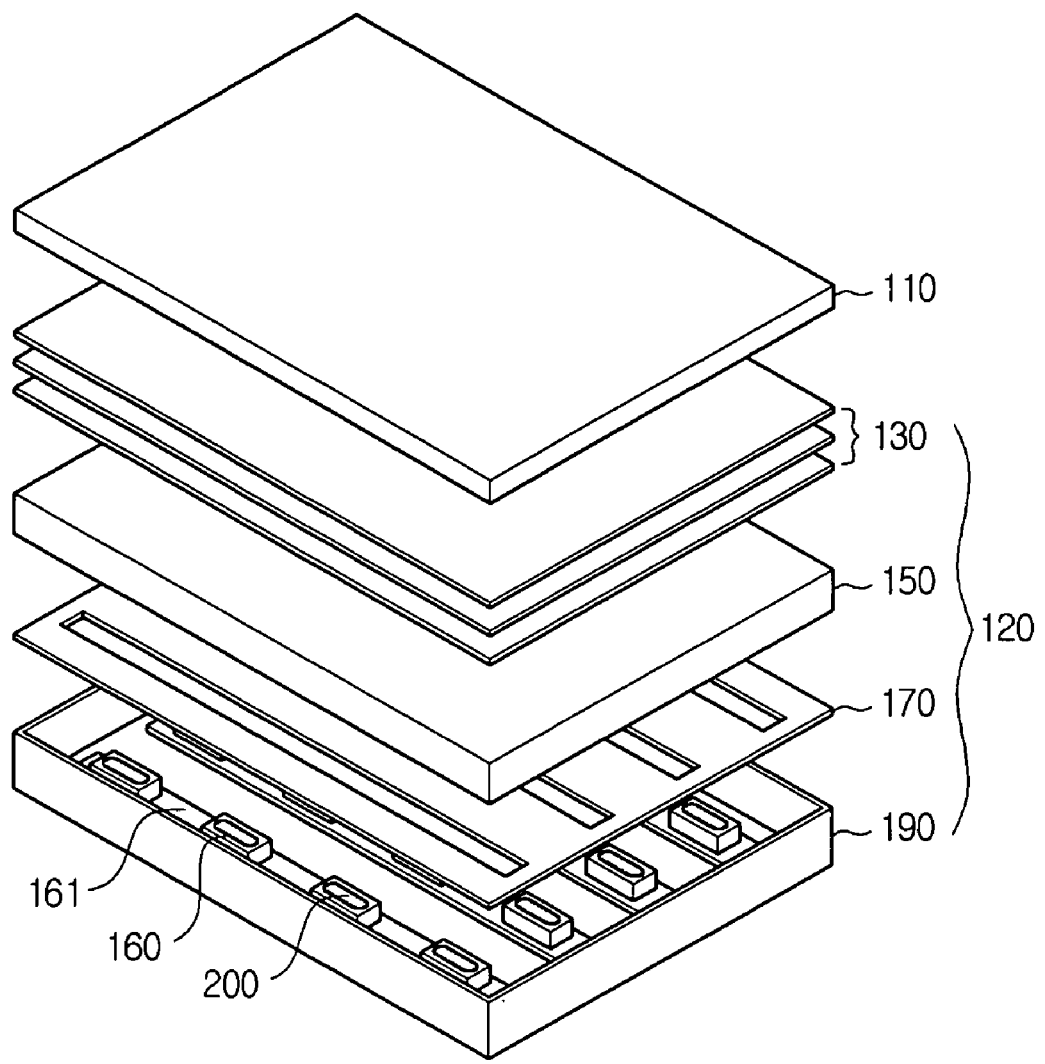
FIG. 8 is an exploded perspective view of a direct type LCD device according to an embodiment of the present invention.

Although an edge type LCD device, in which the LED 160 is disposed on the side surface of the LCD device, is disclosed, the present invention is not limited to the edge type LCD device. Therefore, the present invention may also be applied to a direct type LCD device, in which the LEDs 160 are disposed on a bottom surface of the LCD device and spaced apart by a predetermined distance. FIG. 8 illustrates a direct type LCD device. The same reference numbers as used in FIG. 4 refer to the same parts in FIG. 8. Brightness nonuniformity also occurs in direct type LCD devices, thus, the principles of the present invention are equally applicable to direct type LCD devices. Brightness nonuniformity can be overcome by disposing optical fibers in an LED in the direct type LCD device. These optical fibers aid in diffusing and mixing light.

Accordingly, the optical path of light generated by the LED 160 is changed by disposing the plurality of optical fibers 200 and 400 in the LED 160. The optical fibers 200 and 400 enable a radiation angle (about 110° in the related art) of light, i.e., the maximum angle of emitted light, to be enlarged to be greater than about 110°. Thus, light with uniform brightness is irradiated on the liquid crystal panel. Thus, brightness nonuniformity and hot spots are prevented.

The present invention employs a plurality of optical fibers in LEDs that enlarge a radiation angle of light. This enables an improved image quality because hot spots due to the brightness nonuniformity are prevented by the enlarged radiation angle of light.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A luminescent diode (LED) for a liquid crystal display (LCD) device, comprising:
    a plurality of LED chips to emit light on a side surface of the LCD device;
    a fluorescent mold surrounding the LED chip;
    an epoxy formed on the fluorescent mold; and
    a plurality of optical fibers buried in the epoxy to enlarge a radiation angle of the light,
    wherein each optical fiber includes a core in which light propagates, a cladding layer formed on the core to reflect light, and a coating layer formed on the cladding layer to intensify the strength of the optical fiber.

2. The luminescent diode (LED) according to claim 1, wherein each optical fiber includes one of a glass material and a plastic material.

3. The luminescent diode (LED) according to claim 1, wherein each of the optical fibers is inclined at a predetermined angle in a range of about 20° to about 60° based on a bottom surface of the epoxy.

4. The luminescent diode (LED) according to claim 1, wherein the epoxy includes a first epoxy and a second epoxy on the first epoxy.

5. The luminescent diode (LED) according to claim 1, wherein a length of each optical fiber is about 750 μm, and a diameter of each optical fiber is about 250 μm.

6. A backlight assembly, comprising:
    a light source, the light source includes:
        a plurality of LED chips to emit light around a liquid crystal display device;
        a fluorescent mold surrounding each LED chip;
        a epoxy formed on the fluorescent mold; and
        a plurality of optical fibers buried in the epoxy to enlarge a radiation angle of the light,
        wherein each optical fiber includes a core in which light propagates, a cladding layer formed on the core to reflect light, and a coating layer formed on the cladding layer to intensify the strength of the optical fiber; and
    an optical sheet that diffuses and condenses light emitted from the light source.

7. The backlight assembly according to claim 6, further comprising a light guide plate substantially coplanar with the light source that converts light generated from the light source into a surface light and that irradiates light towards the liquid crystal display device.

8. The backlight assembly according to claim 6, wherein each optical fiber has a predetermined tilt angle in a range of about 20° to about 60° based on a bottom surface of the epoxy.

9. A luminescent diode (LED) for a liquid crystal display (LCD) device, comprising:
    a plurality of LED chips to emit light on a bottom surface of the LCD device;
    a fluorescent mold surrounding the LED chip;
    an epoxy formed on the fluorescent mold; and
    a plurality of optical fibers buried in the epoxy to enlarge a radiation angle of the light,
wherein each optical fiber includes a core in which light propagates, a cladding layer formed on the core to reflect light, and a coating layer formed on the cladding layer to intensify the strength of the optical fiber.

* * * * *